(12) United States Patent
Hamelin et al.

(10) Patent No.: US 10,947,111 B2
(45) Date of Patent: Mar. 16, 2021

(54) METHOD FOR FREQUENCY TRIMMING A MICROELECTROMECHANICAL RESONATOR

(71) Applicant: Georgia Tech Research Corporation, Atlanta, GA (US)

(72) Inventors: Benoit Hamelin, Atlanta, GA (US); Farrokh Ayazi, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 461 days.

(21) Appl. No.: 15/875,943

(22) Filed: Jan. 19, 2018

(65) Prior Publication Data

US 2018/0222748 A1 Aug. 9, 2018

Related U.S. Application Data

(60) Provisional application No. 62/447,951, filed on Jan. 19, 2017.

(51) Int. Cl.
*H04R 31/00* (2006.01)
*G01R 3/00* (2006.01)
(Continued)

(52) U.S. Cl.
CPC ........ *B81C 1/0065* (2013.01); *B23K 26/0006* (2013.01); *B23K 26/20* (2013.01);
(Continued)

(58) Field of Classification Search
CPC ............ B81B 3/007; B81B 2201/0242; B81B 2201/0271; B81C 1/0065;
(Continued)

(56) References Cited

U.S. PATENT DOCUMENTS

| 4,451,303 | A | * | 5/1984 | Hiraki | ................. | H01L 21/2256 |
| | | | | | | 257/E21.15 |
| 4,974,930 | A | * | 12/1990 | Blyler, Jr. | .............. | G02B 6/021 |
| | | | | | | 385/15 |

(Continued)

FOREIGN PATENT DOCUMENTS

JP 02265238 A * 10/1990

OTHER PUBLICATIONS

Savchenkov et al. Ultraviolet-assisted Frequency Trimming of Optical Microsphere Resonators. Optics Letters, vol. 28, Issue No. 8, Apr. 15, 2003, pp. 649-650.

(Continued)

*Primary Examiner* — Paul D Kim
(74) *Attorney, Agent, or Firm* — Troutman Pepper Hamilton Sanders LLP; Ryan A. Schneider

(57) ABSTRACT

Embodiments of the present disclosure can include a method for frequency trimming a microelectromechanical resonator, the resonator comprising a substrate and a plurality of loading elements layered on a surface of the substrate, the method comprising: selecting a first loading element of the plurality of loading elements, the first loading element being layered on a surface of a region of interest of the substrate; heating the first loading element and substrate within the region of interest to a predetermined temperature using an optical energy source, causing the first loading element to diffuse into the substrate; and cooling the region of interest to form a eutectic composition layer bonding the loading element and the substrate within the region of interest.

17 Claims, 10 Drawing Sheets

(51) Int. Cl.
*B81C 1/00* (2006.01)
*B23K 26/20* (2014.01)
*H03H 3/013* (2006.01)
*B23K 26/34* (2014.01)
*B23K 26/351* (2014.01)
*B23K 26/00* (2014.01)
*H03H 3/04* (2006.01)
*B23K 26/354* (2014.01)
*B81B 3/00* (2006.01)
*H01L 41/253* (2013.01)
*B23K 103/00* (2006.01)
*B23K 103/08* (2006.01)
*B23K 101/40* (2006.01)

(52) U.S. Cl.
CPC ............ *B23K 26/34* (2013.01); *B23K 26/351* (2015.10); *B23K 26/354* (2015.10); *B81B 3/007* (2013.01); *H03H 3/013* (2013.01); *H03H 3/04* (2013.01); *B23K 2101/40* (2018.08); *B23K 2103/08* (2018.08); *B23K 2103/52* (2018.08); *B81B 2201/0242* (2013.01); *B81B 2201/0271* (2013.01); *B81C 2201/0166* (2013.01); *B81C 2201/0167* (2013.01); *B81C 2201/0169* (2013.01); *H01L 41/253* (2013.01)

(58) Field of Classification Search
CPC .... B81C 2201/0166; B81C 2201/0167; B81C 2201/0169; B23K 26/34; B23K 26/0006; B23K 26/20; B23K 26/351; B23K 26/354; B23K 2103/08; B23K 2103/52; B23K 2101/40; H03H 3/013; H03H 3/04; H01L 41/253
See application file for complete search history.

(56) References Cited

U.S. PATENT DOCUMENTS

| | | | |
|---|---|---|---|
| 6,133,119 A * | 10/2000 | Yamazaki | H01L 31/02167 438/476 |
| 6,888,987 B2 | 5/2005 | Sercel et al. | |
| 6,987,914 B2 | 1/2006 | Savchenkov et al. | |
| 7,369,010 B2 | 5/2008 | Alvarez et al. | |
| 7,806,586 B2 * | 10/2010 | Melamud | G01L 9/0022 374/117 |
| 7,851,336 B2 * | 12/2010 | Poplavskyy | H01L 21/02579 438/479 |
| 8,061,013 B2 | 11/2011 | Ayazi et al. | |
| 9,312,420 B2 * | 4/2016 | Jin | H01L 31/18 |
| 9,465,169 B2 | 10/2016 | Djordjevic et al. | |
| 2016/0219719 A1 | 7/2016 | Whiston et al. | |

OTHER PUBLICATIONS

Hänel et al. Laser Trimming of Micro Mirror Devices, Ultrashort UV-Laserpulses Allow Ultra-precise Processing. Laser Technik Journal, vol. 5, Issue No. 1, Dec. 2007, pp. 36-39.

* cited by examiner

METHOD FOR FREQUENCY TRIMMING A MICROELECTROMECHANICAL RESONATOR

CROSS-REFERENCE TO RELATED APPLICATIONS

This application, filed Jan. 19, 2018, claims the benefit of U.S. Provisional Patent Application Ser. No. 62/447,951, filed Jan. 19, 2017, entitled "Stiffness Trimming of High Q MEMs Resonators by Excimer Laser Annealing of Germanium Thin Film on Silicon," the entire contents and substance of which are hereby incorporated by reference as if fully set forth below.

STATEMENT REGARDING FEDERALLY SPONSORED RESEARCH

This invention was made with government support under grant number HR0011-00-C-0032 awarded by the United States Department of Defense Advance Research Projects Agency. The government has certain rights in the invention.

BACKGROUND

High-Q single-crystal silicon (Si) MEMS resonators are being developed as small form-factor, integrated alternatives to more established quartz resonators in a wide frequency range. Resonators may be subjected to small frequency fluctuations due to varying environmental factors, such as temperature and pressure, or larger frequency variations due to manufacturing inaccuracies (e.g. photolithography, etching, thickness variation) or packaging stresses that cause a shift in the resonance frequency. These frequency fluctuations need to be compensated for in applications requiring high precision frequency control.

BRIEF SUMMARY

Embodiments of the present disclosure can include a method for frequency trimming a microelectromechanical resonator, the resonator comprising a substrate and a plurality of loading elements layered on a surface of the substrate, the method comprising: selecting a first loading element of the plurality of loading elements, the first loading element being layered on a surface of a region of interest of the substrate; heating the first loading element and substrate within the region of interest to a predetermined temperature using an optical energy source, causing the first loading element to diffuse into the substrate; and cooling the region of interest to form a eutectic composition layer bonding the loading element and the substrate within the region of interest.

In some embodiments, the plurality of loading elements can comprise at least one of germanium, gold, aluminum, silver, lead, platinum, iron, copper, aluminum oxide, silicon, or nickel and the substrate comprises at least one of silicon or silicon carbide. In some embodiments, the first loading element can comprise germanium, the substrate can comprise silicon, and the predetermined temperature can be between 900 and 1000 Centigrade.

In some embodiments, the first loading element can be selected based on a strain energy of the resonator. In some embodiments, the region of interest can comprise a portion of the substrate having a length and width that is approximately equal to the length and width of the first loading element.

In some embodiments, the optical energy source can comprise an ultra-violet laser, and the heating comprises emitting, by the ultra-violet laser, ultra-violet light onto the first loading element. In some embodiments, the ultra-violet light can have a predetermined wavelength based on the transparency of the region of interest to light.

In some embodiments, the resonator can further comprise a packaging layer that is transparent to the optical energy source and the trimming is performed post-packaging. In some embodiments, the resonator can be fabricated on a wafer and comprises a packaging layer that is transparent to the optical energy source, and the trimming can be performed post-packaging. In some embodiments, the resonator can be fabricated on a wafer and the trimming can be performed at the wafer level.

Embodiments of the present disclosure can comprise a method of shifting a resonator frequency, the method comprising: providing the resonator having a first resonance frequency, the resonator comprising a substrate and a loading element applied on a surface of the substrate, wherein the loading element comprises a first composition and the substrate comprises a second composition; and shifting the resonator from the first resonance frequency to a second resonance frequency, wherein the shifting comprises: applying light to a region of interest of the resonator to heat the region of interest, wherein the heating causes a portion of the loading element diffuse into a portion of the substrate; and cooling the region of interest to form a eutectic composition within the substrate comprising a mixture of the first composition and the second composition.

In some embodiments, the resonator is one from among a silicon bulk acoustic resonator, a film bulk acoustic wave resonator, a high-Q single-crystal resonator, a microelectromechanical resonator, and a Coriolis gyroscope.

In some embodiments, the eutectic composition can comprise a polycrystalline mixture of the first composition and the second composition.

In some embodiments, the region of interest can comprise the loading element and the light is applied to the loading element.

Embodiments of the present disclosure can comprise a method for frequency trimming a microelectromechanical resonator, the resonator comprising a substrate and a plurality of loading elements layered on a surface of the substrate, the method comprising: selecting a first loading element of the plurality of loading elements for frequency trimming, the first loading element disposed layered on a region of interest of the substrate; heating the first loading element to a predetermined temperature, causing the loading element to diffuse into the region of interest of the substrate to form a eutectic composition layer; and cooling the eutectic composition layer to bond the loading element and the substrate within the region of interest.

In some embodiments, the region of interest can comprise a portion of the substrate having a length and width that is substantially equal to a length and width of the first loading segment.

DETAILED DESCRIPTION

Figure 1:
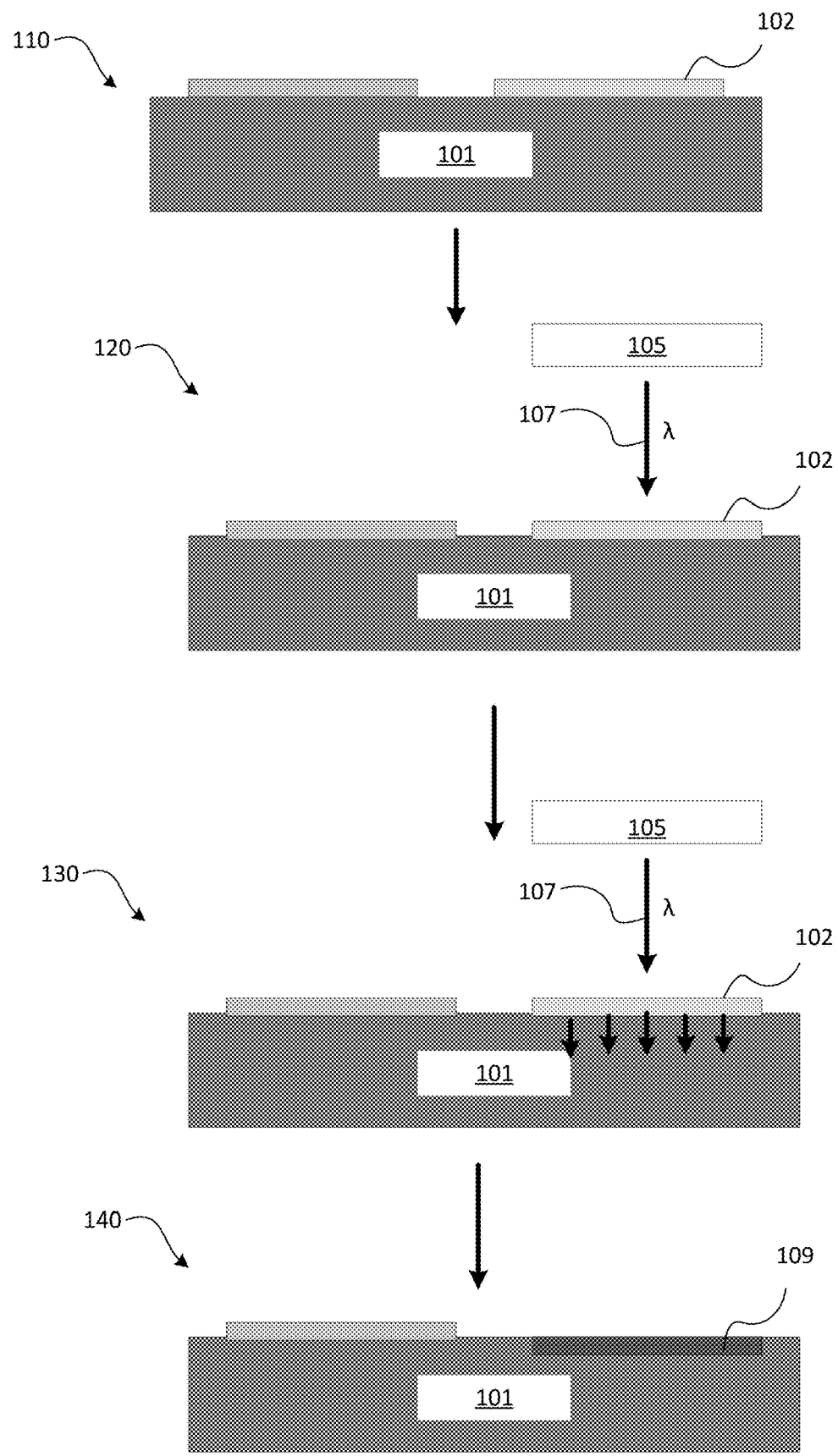
FIG. 1 shows an exemplary method for stiffness trimming of a resonator, in accordance with one or more embodiments of the present disclosure.

Although preferred embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. The disclosure is capable of other embodiments and of being practiced or carried out in various ways. Also, in describing the preferred embodiments, specific terminology will be resorted to for the sake of clarity.

It must also be noted that, as used in the specification and the appended claims, the singular forms "a," "an" and "the" include plural referents unless the context clearly dictates otherwise.

Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Ranges can be expressed herein as from "about" or "approximately" one particular value and/or to "about" or "approximately" another particular value. When such a range is expressed, another embodiment includes from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a device or system does not preclude the presence of additional components or intervening components between those components expressly identified.

Embodiments of the present disclosure can include systems and methods for optically trimming micro-electromechanical (MEMs) resonators. Manufacturing inaccuracies (e.g. due to photolithography, etching, thickness variation) may cause large-scale frequency variations that may require compensation via physical trimming. Additionally, packaging stress may cause a shift in resonance frequency, which needs to be compensated in applications requiring high-precision frequency control. In such situations, resonance tuning or other temporary methods may not achieve changes in frequency sufficient to compensate for these inaccuracies. Therefore, embodiments of the present disclosure relate to permanent trimming of resonators to achieve desired frequency adjustments.

Electrostatic spring softening is a well-known and popular way of fine-tuning the frequency of a silicon MEMs resonator, post-fabrication. Although electrostatic tuning becomes more effective with high-aspect-ratio (HAR) nano-gap capacitive transducers, it is generally inefficient in tuning stiff bulk-mode resonators. Focus-ion-beam (FIB) and laser-based mass tuning methods have also been extensively explored but frequently suffer from poor control of mass variation (e.g. ablation and deposition), due to uncontrolled redeposition of ablated material. Throughout the last decade various other zero power frequency trimming methods have been researched including polysilicon deposition, localized annealing, and oxidation.

Another method for frequency trimming is thermal diffusion via Joule heating of a thin-film metallic layer into the bulk of resonating elements. Joule heating allows a thin metal layer to diffuse against large temporary temperature gradients into the bulk of silicon resonator; above a certain threshold temperature ($T_{metal-Si}$), the metal and silicon binary system melts. Upon cooling and resolidifaction of the melting front, the thermo-migrated metallic layer forms a binary metal-Si alloy within the silicon substrate. The mechanical properties of the metal-silicon bonds, generated in these binary alloys, are controlled by adjusting the relative concentration of the metal compound in the metal-silicon alloy. Depending on the metal, the formation of binary metal-Si alloys leads either to an overall increase or decrease of the stiffness of the resonant structures. The magnitude of the stiffness variation depends on the amount and location of these metal-Si bonds. Increasing (or decreasing) stiffness leads to an upward (or downward) permanent frequency shift of the metal-coated Si resonators.

Known methods for physically trimming resonators include mass trimming methods which involve using laser ablation or other ablative methods to permanently remove the physical mass of a resonator. But these methods suffer from poor control of mass variation (e.g. ablation and deposition) due to uncontrolled redeposition of ablated material. Other methods, such as Joule heating, allow for frequency adjustment but are not localized and could only be achieved using metals with a low melting temperature (such as gold or aluminum) as subjecting the tethers holding the resonator to the electronic pad would deteriorate or become damaged if subjected to high temperatures. For instance, germanium as the loading element for thermal trimming can be advantageous because the high threshold temperature of a SiGe binary eutectic system ($T_{Ge-Si}$ 938° C.). Since $T_{Ge-Si}$ and the plastic deformation of Si (~1100° C.) are in close vicinity, SiGe crystallization via Joule heating may inevitably lead to the plastic deformation of narrow tethers that support the resonator.

Embodiments of the present disclosure can allow for frequency adjustment of resonators by permanently adjusting the stiffness of the resonator. Stiffness trimming, contrary to mass trimming, does not redeposit any trimmed material since no material is ablated or removed from the resonator. Stiffness trimming instead can include adjusting the stiffness (e.g. the Young's modulus) of portions of a resonator within a region of interest. In some embodiments, stiffness trimming can rely on the eutectic properties of substrate materials and loading elements disposed on a surface of the substrate. In some embodiments, by using focused optical energy, localized stiffness trimming of a resonator can be achieved allowing for fine frequency trimming as well as both pre- and post-packaging trimming, i.e. before or after the resonator is encapsulated in a package. Moreover, in some embodiments, stiffness trimming can be achieved using the presently disclosed systems and methods without any significant degradation of the quality (Q) factor of the resonators. Particularly, in high-Q resonators (having Q~300,000), stiffness trimming can have little effect on the Q factor of these resonators.

In some embodiments, stiffness trimming can rely on eutectic properties of the constituent materials of the substrate and loading (or trimming) layer. As will be understood by those skilled in the art, the term "eutectic" can refer to a mixture of substances that melt and solidify at a single temperature that is lower than the melting points of the separate constituents. The eutectic point therefore can occur when two materials form a eutectic composition defined by a certain concentration of the materials. When the eutectic composition solidifies, it forms a crystalline layer that has a different Young's modulus than the substrate material. In other words, the crystalline eutectic composition can comprise a higher or lower Young's modulus than the substrate. As such, the overall stiffness of the resonator can be adjusted. Additionally, by increasing or decreasing the amount of loading element in the resultant eutectic composition, the stiffness adjustments of the resonator can be controlled. For instance, in an embodiment where the loading element is composed of germanium and the substrate is composed of silicon, the Young's modulus can decrease proportionally to the concentration of germanium in the polycrystalline eutectic layer composed of germanium-Silicon.

Embodiments of the present disclosure allow for localized, optical trimming which allows for frequency adjustment both before and after packaging. FIG. 1 illustrates an exemplary method for localized trimming of a resonator, in accordance with one or more embodiments of the present disclosure. The method can comprise: providing a resonator having a first resonance frequency (110), the resonator comprising a substrate 101 and at least one loading element 102 applied on a surface of a portion of the substrate; and trimming the resonator (120, 130) to adjust the stiffness of the resonator, and shift the resonator from the first resonance frequency to the second resonance frequency. In some embodiments, the step of trimming comprises shifting the resonator from the first resonance frequency to a second resonance frequency which can include applying light 107 at a predetermined wavelength (λ) to a region of interest of the resonator to heat the region of interest (120), wherein the heating causes the first composition to diffuse into the second composition (130); and cooling the region of interest to form a eutectic composition 109 within the substrate 101 comprising a mixture of the first composition and the second composition. In some embodiments, the light 107 can be applied by an optical energy source 105.

Figure 2:
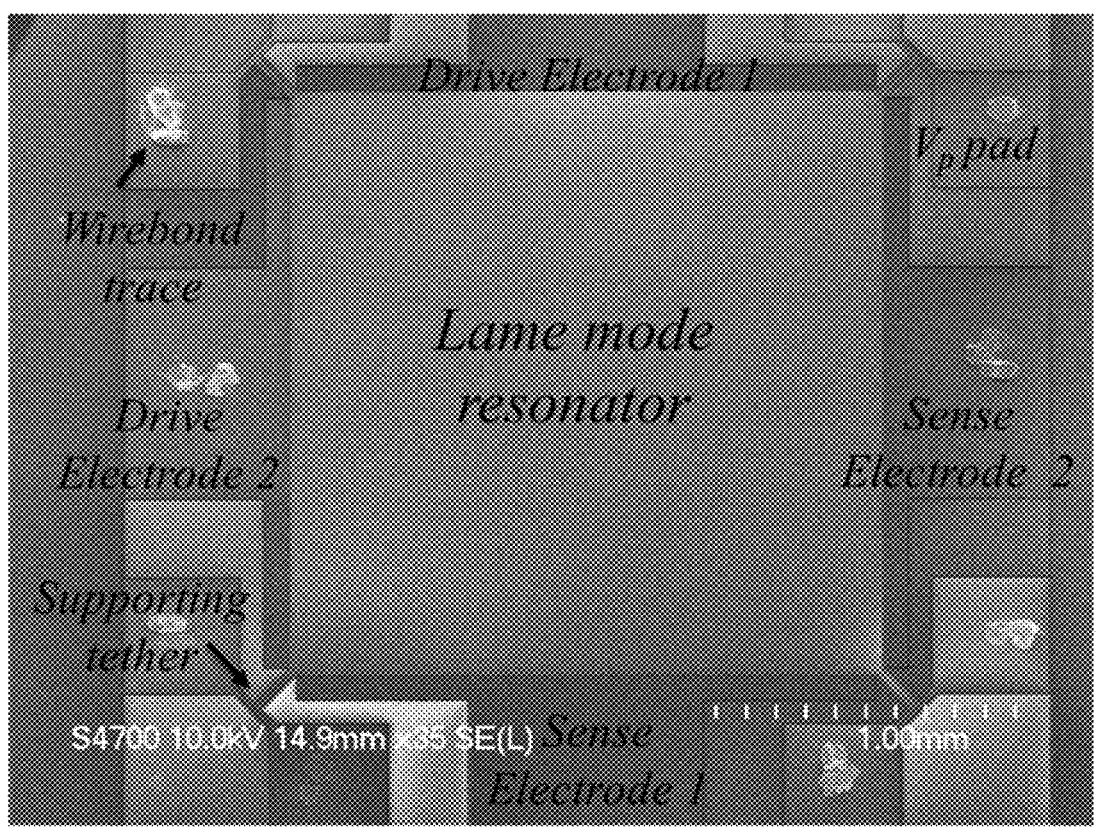
FIG. 2 shows an SEM view of a Lame mode silicon resonator, in accordance with one or more embodiments of the present disclosure.

Embodiments of the present disclosure can be used with a variety of resonator devices including any MEMs resonator. Resonator devices can include but are not limited to silicon bulk acoustic resonators, film bulk acoustic wave resonators, stiff bulk-mode resonators, high-Q single-crystal resonators, and a Coriolis gyroscope. For example, FIG. 2 shows an exemplary lame mode resonator incorporating drive electrodes and sense electrodes. Additionally, the presently disclosed trimming systems and methods can be used to trim any piezoelectric resonator now known or later discovered. Further, the presently disclosed systems or methods can be achieved with resonators having 2D or 3D surfaces. In other words, the surface of the resonator need not be flat and can have portions that are 3D.

While the method above is described with respect to shifts in resonance frequencies, in some embodiments, the disclosed systems and methods can be used in devices with multiple modes. Therefore, in some embodiments, the disclosed systems and methods can allow shift of frequencies of some modes with respect to other modes. Those skilled in the art would understand that this allows for changing the frequency separation of two or more modes, whether that involves increasing the frequency separation or decreasing the frequency separation. Previous methods, such as Joule heating, could not achieve this because they do not allow for localized trimming.

In some embodiments, the loading element can be composed of a first composition and the substrate can be composed of a second composition. In some embodiments, the substrate can be composed of at least one of silicon sapphire, aluminum nitride, diamond, silicon nitride, or silicon carbide. In some embodiments, the loading element can be composed of a metals or semi-conductors. Suitable materials can include germanium, gold, aluminum, silver, lead, platinum, iron, copper, aluminum oxide, silicon, or nickel. In other embodiments, the substrate can be composed of silicon carbide. In some embodiments, the binary eutectic system can include a loading element composed of germanium and a substrate composed of silicon. One advantage of using germanium with silicon is that the threshold temperature for forming the germanium-silicon binary system is high enough that the mixture can withstand high temperature applied to the device during packaging as well as during manufacturing and use of the device. While several example materials are provided for the loading element and substrate, it is understood that other materials can be used that are now known or later discovered. Additionally, while the substrate is described as being composed of certain materials and the loading element is described as being composed of certain materials it is understood that the loading element and the substrate could be switched such that the substrate is composed of loading element materials and the loading element is composed of substrate materials.

In some embodiments, the loading elements can be thin-film loading elements. As used herein, thin-film can refer to loading elements that have an overall thickness that is smaller than that of the substrate. In some embodiments, the thickness of the loading element can be less than 1 micron. In some embodiments, the loading elements can be from 1 nm to 1 micron, 1 nm to 900 nm, 1 nm to 800 nm, 1 nm to 700 nm, 1 nm to 600 nm, 1 nm to 500 nm, 1 nm to 400 nm, 1 nm, to 300 nm, 1 nm to 200 nm, 1 nm to 100 nm, 1 nm to 90 nm, 1 nm to 80 nm, 1 nm to 75 nm, 1 nm to 70 nm, 1 nm to 60 nm, 1 nm to 50 nm, 1 nm to 40 nm, 1 nm to 30 nm, 1 nm to 25 nm, 1 nm to 20 nm, 1 nm to 15 nm, 1 nm to 10 nm, 1 nm to 5 nm, 1 nm to 3 nm. In other embodiments, the thickness of the loading element can be 1 nm, 2 nm, 3 nm, 4 nm, 5 nm, 10 nm, 15 nm, 20 nm, 25 nm, 50 nm, 75 nm, 100 nm, 125 nm, 150 nm, 175 nm, 200 nm, 225 nm, 250 nm, 275 nm, 300 nm, 350 nm, 400 nm, 450 nm, 500 nm, 750 nm, 1000 nm. In some embodiments, the thickness of the loading element can exceed 1 micron.

Additionally, the resonator can be decorated by any number of loading elements depending on design parameters. In some embodiments, the resonator can comprise a plurality of loading elements and one or more of those loading elements can be selected for localized trimming depending on the frequency properties of the resonator. In some embodiments, the loading elements selected for heating can be selected based on the strain energy of the resonator. In some embodiments, one or more loading elements can be applied to a surface of the substrate of the resonator. Additionally, depending on the desired frequency shift, the trimming process can be applied on any number of loading elements. One advantage of the present disclosure is the ability to provide localized stiffness trimming, as compared to methods involving Joule heating. In other words, upon ascertaining a desired frequency shift, one or more of the loading elements can be selected for localized trimming.

In some embodiments, the region of interest of the substrate can include a portion of the substrate directly below the loading element that has a length and width approximately equal to the length and width of the loading element. In some embodiments, the region of interest can include the trimming layer and a portion of the substrate directly below the loading element that has a length and width approximately equal to the length and width of the loading element. In some embodiments, the region of interest can be approximately the size of the trimming layer.

Figure 3:
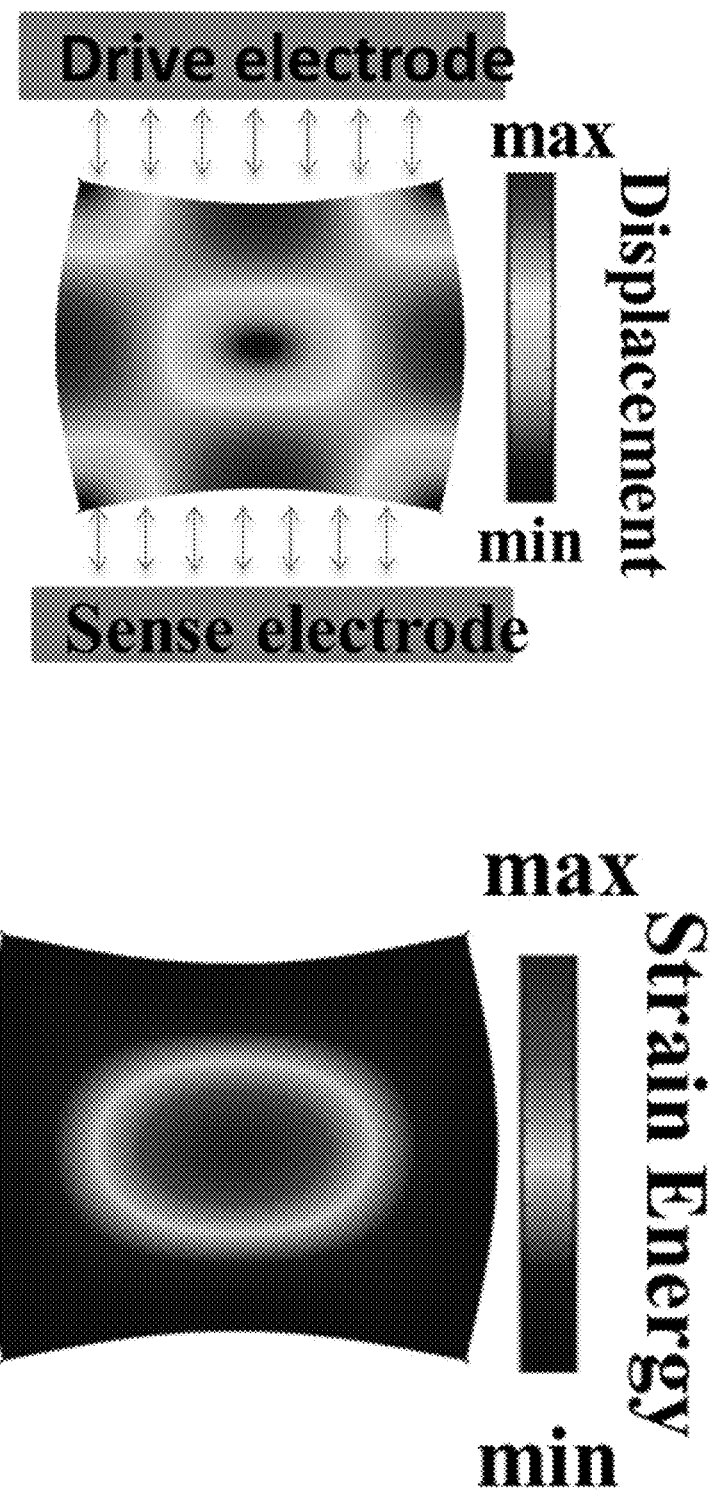
FIG. 3 shows an actuation schematic of a Lame mode silicon resonator and that locations with high strain energy (colored in red) contribute more to the trimming process than locations with low strain energy (blue), in accordance with one or more embodiments of the present disclosure.

In some embodiments, the region of interest can be chosen based on a strain energy measured within the region of interest. Trimming at a location of high strain energy (e.g. FIG. 3) will shift the frequencies more than when trimming at a location of low strain energy. For instance, in the case of a Lame mode resonator, the strain energy is the largest about a center of the resonator. For instance, trimming a few loading elements and mapping the resulting frequency shifting to numerical simulations of the mode shape of interest can give an accurate representation of the strain energy map across a MEMs resonator.

In some embodiments, after diffusion of the first composition into the second composition, the region of interest can be cooled to form a eutectic composition within the substrate comprising a mixture of the first composition and the second composition, as illustrated in FIG. 1 at 140. In some embodiments, the eutectic system can be a binary eutectic system meaning that the eutectic system can be composed of a mixture of two components. For instance, in an embodiment where the first composition comprises germanium and the second composition comprises silicon, the binary eutectic system comprises the alloy of silicon and germanium.

In some embodiments, the loading element and substrate can be heated to a predetermined temperature based on the eutectic properties of the loading element and substrate. For instance, in an embodiment where the loading element comprises germanium and the substrate comprises silicon, the predetermined temperature can be between 900 and 1000° C. In particular, in some embodiments, the predetermined temperature can be about 938° C. In some embodiments, where the loading element comprises gold, the predetermined temperature can be between 300 and 400° C. In particular, in some embodiments, the predetermined temperature can be about 363° C. In some embodiments, where the loading element comprises aluminum, the predetermined temperature can be between 550 and 650° C. In particular, in some embodiments, the predetermined temperature can be about 577° C.

In some embodiments, the optical energy source is an ultra-violet (UV) laser that can emit ultra-violet light. In some embodiments, the UV laser is configured at a predetermined wavelength based on the optical properties of the resonator. For instance, the wavelength of the laser can be adjusted as desired based on the transparency of the substrate, the loading element, and in embodiments where trimming is performed post-packaging, of the capping or encapsulation layer incorporated during packaging. In some embodiments, the wavelength of the laser can be from 1 to 1100 nm. In some embodiments, the wavelength of the laser can be from 1 to 400 nm, from 200 to 400 nm, from 300 and to 400 nm, 100 nm, 150 nm, 200 nm, 250 nm, 300 nm, 350 nm, 400 nm. In some embodiments, the wavelength of the laser can be about 349 nm. In some embodiments, the optical energy source is a UV laser including a pulsed excimer laser. In other embodiments, the wavelength of the laser can be within the visible light wavelength, having a wavelength from 390 to 700 nm. In some embodiments, the wavelength can be greater than 700, including but not limited to 700 nm, 750 nm, 800 nm, 850 nm, 900 nm, 950 nm, 1000 nm, and 1100 nm. Those skilled in the art would understand that the wavelength of light applied to the resonator can be any wavelength so long as the resonator or post-packaged resonator is transparent to the light wavelength of the laser.

In some embodiments, the presently disclosed systems and methods can be achieved using a digital algorithm for selecting loading elements and controlling the optical energy source. In this method, each loading element can either be trimmed ("0") or not ("1"); when trimmed, the amount of trimming can be self-limited by the volume of the loading layer. This can be in sharp comparison with mass trimming which is not self-limited—it can continue as long as the laser is on; therefore, mass trimming cannot practically be represented digitally like in the presently disclosed method. The digital representation of stiffness trimming can enable writing algorithms to discover which elements needs to be trimmed based on the desired frequency change.

In some embodiments, the resonator can be packaged prior to localized trimming. For instance, a packaged resonator may be part of a micro-electromechanical device including a capping element. The capping element can be bonded directly to the resonator substrate or to a carrier substrate on which the resonator substrate is placed to create a controlled environment for the resonator, such as a vacuum environment. In some cases, wafer level packaging might be used for encapsulating a plurality of resonators fabricated on a wafer. This can be done by bonding a silicon or a glass capping wafer to the resonator or device wafer. In embodiments in which the above-described methods are performed post-packaging, the heating using an optical energy source can performed through a packaging layer composed of a material that is transparent to the optical energy source. Transparent can refer to the property of transmitting light without appreciable scattering. For instance, in an embodiment of the present method made post-packaging, transparency allows the laser spot size and laser power to not be affected by the presence of the package. In some embodiments, the packaging layer can be composed of silicon or glass. In some embodiments, the capping element can include glass or silicon. Therefore, the environment in which the system is trimmed could have a pressure ranging from micro-Torr to atmospheric pressure with inert gases such as Argon. Upon heating, residual oxygen or nitrogen gas could lead to oxidation or nitridation of the silicon layer which could affect the trimming process. In some cases, the capping element or the resonator substarte can incorporate a thin film getter for chemically absorbing residual gases in the package environment, for example to create a high vacuum.

A person of ordinary skill in the art would understand that, in some embodiments, the herein-described resonators can be fabricated on a wafer or chip using any known wafer-level processing or fabrication techniques.

EXAMPLES

The present disclosed technology is also described and demonstrated by way of the following example. However, the use of these and other examples anywhere in the specification is illustrative only and in no way limits the scope and meaning of the disclosure or of any exemplified term. Likewise, the disclosure is not limited to any particular preferred embodiments described here. Indeed, many modifications and variations of the disclosure may be apparent to those skilled in the art upon reading this specification, and such variations can be made without departing from the disclosure in spirit or in scope. The disclosure is therefore to be limited only by the terms of the appended claims along with the full scope of equivalents to which those claims are entitled.

Example 1

Figure 4:
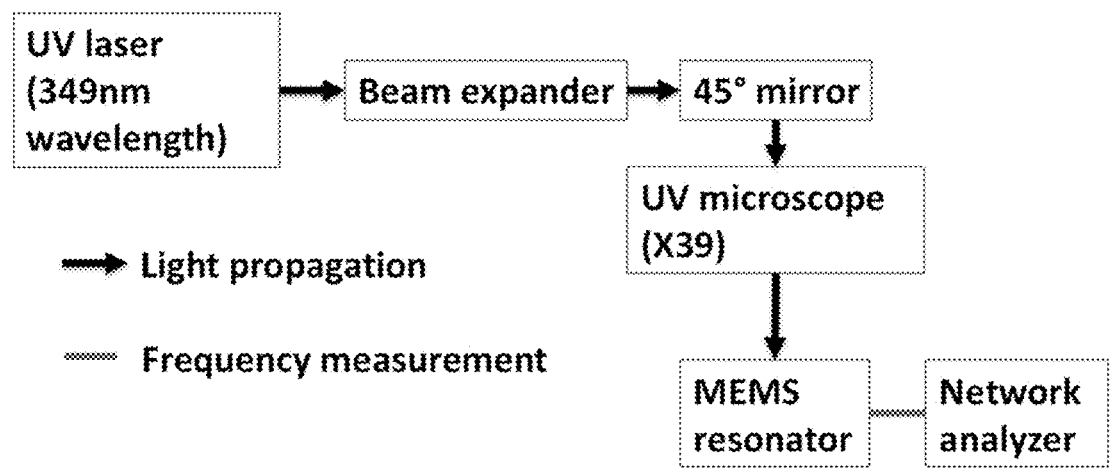
FIG. 4 shows a schematic of the experimental set-up for pulsed excimer laser stiffness trimming, in accordance with one or more embodiments of the present disclosure.
Figure 5:
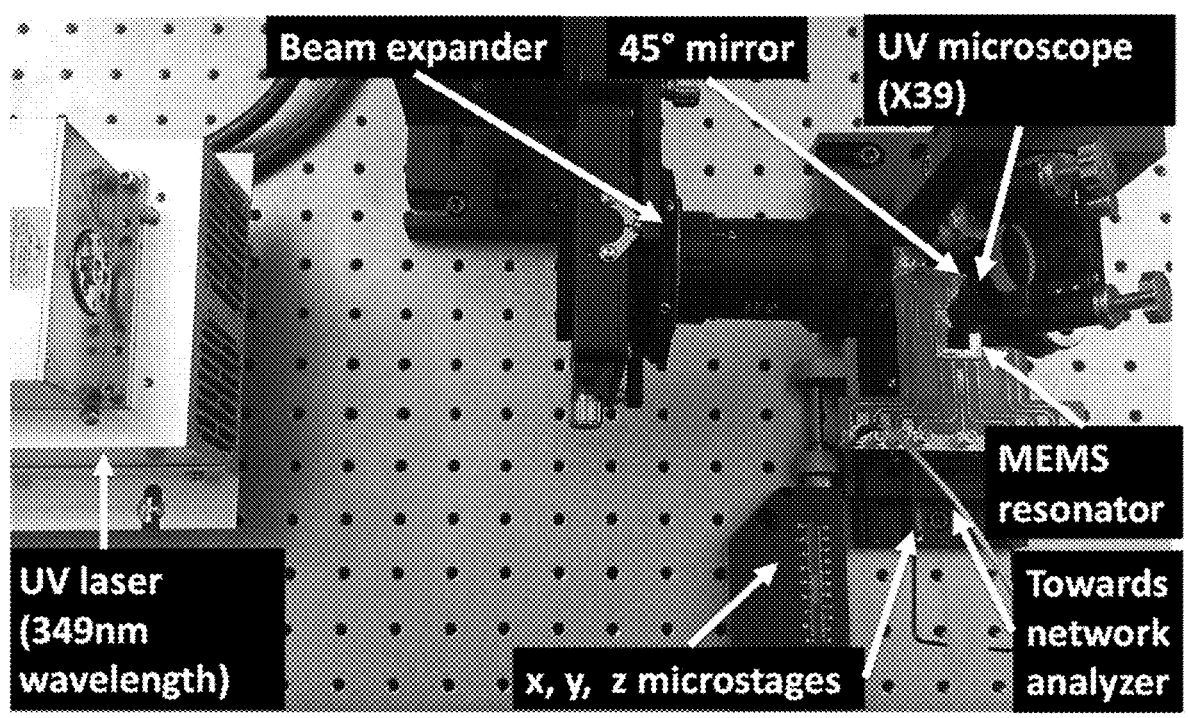
FIG. 5 shows an actual view of the experimental set-up for pulsed excimer laser stiffness trimming, in accordance with one or more embodiments of the present disclosure.

Thin-film germanium (Ge) can be used as the loading element for thermal trimming owing to the high threshold temperature of the silicon-germanium (SiGe) binary eutectic system ($T_{Ge-Si}$=938° C.). Since $T_{Ge-Si}$ and the plastic deformation temperature of Si (~1100° C.) are in close vicinity, SiGe crystallization via Joule heating may inevitably lead to the plastic deformation of narrow tethers that support the resonator. Using the described systems and methods, gradients can be generated by irradiating the Ge loading thin-film layer with a pulsed excimer laser (FIGS. 4 and 5). Benefiting from high spatial resolution, optical heating avoids any deformation of the anchoring tethers. A UV laser is used to take advantage of the high absorption coefficient of Ge at the wavelength of 349 nm ($\alpha$~$10^6$ cm$^{-1}$).

SiGe crystals are strained systems owing to the important lattice mismatch between Si and Ge. Strained systems follow a particular growth model, namely the Stranski-Krastanow (S-K) model. The S-K growth model is described as 2D layer and 3D islands growth. These 3D islands undesirably increase the roughness of trimmed Si resonators. Nevertheless, the additional roughness can be reduced by using a surfactant (e.g. arsenic) to lower surface tension of the Si surface. While optimum surface roughness can also be achieved by reducing the number of laser pulses (<10), a large number of pulses (~300) was used to ensure that the melting front penetrates deep into the substrate while keeping the temperature of the top surface below Ge vaporization point.

While ablation of the Ge thin-film would suffice to provide frequency control of these Si MEMS resonators, micro-crystallization of SiGe, without ablation can also be used to adjust the resonance frequency of Ge-coated Si resonators with good accuracy. In particular, the gradual solidification of the melting front during pulsed laser stiffness trimming can potentially be more tightly controlled than the abrupt vaporization of the loading layer during mass trimming, thereby reducing the frequency shift quanta in physical trimming via laser-based methods.

$$Si_xGe_{1-x}(GPa): \begin{cases} c_{11} = 165.8 - 37.3 \cdot x \\ c_{12} = 63.9 - 15.6 \cdot x \\ c_{44} = 79.6 - 12.8 \cdot x \end{cases} \quad (1)$$

$$E_{\langle 100 \rangle} = \frac{1}{2}(c_{11} - c_{12}) \quad (2)$$
$$E_{\langle 100 \rangle} = c_{44}$$

$$f_{Lame} = \frac{1}{\sqrt{2}L}\sqrt{\frac{E}{\rho}} \quad (3)$$

Figure 6:
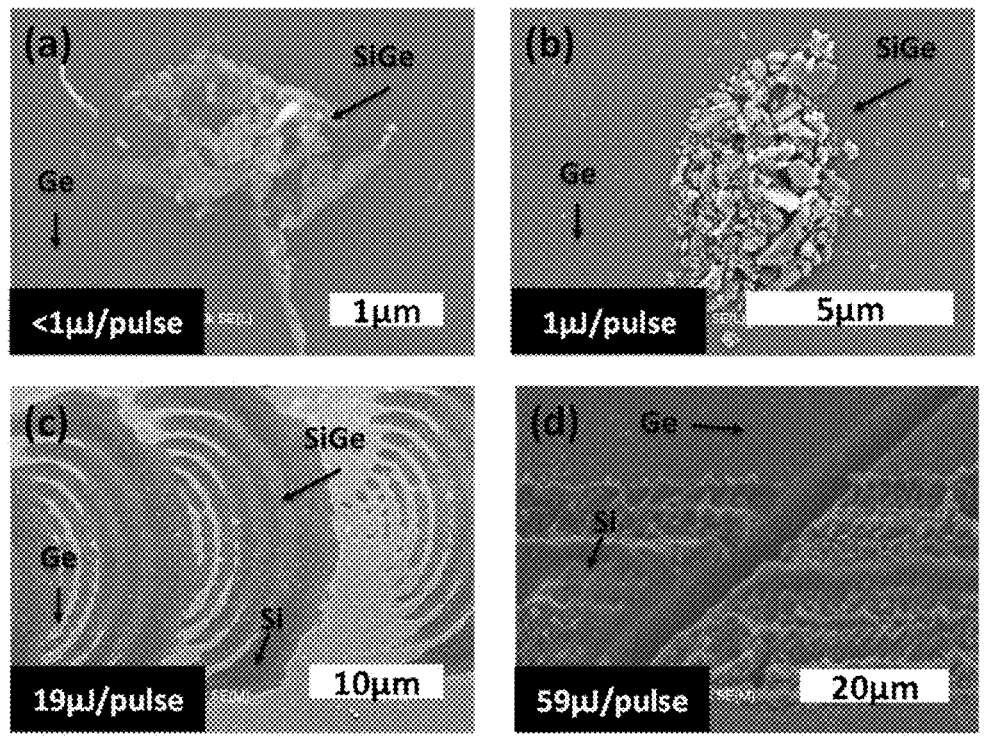
FIG. 6 shows several photographs comparing the effects of low laser power and high laser power on SiGe crystals, in accordance with one or more embodiments of the present disclosure.

Optimum laser power leads to the formation of SiGe crystals without inducing any observable ablation. Ex situ monitoring of SiGe films using a Hitachi 4700 Scanning Electron Microscope (SEM) reveals the formation of 3D islands of SiGe at low laser fluences (<1 µJ/pulse, 11 µJ/pulse respectively) (FIG. 6 at (a) and (b)) and melting (FIG. 6 at (c)) followed by ablation (FIG. 6 at (d)) at high laser fluences. FIG. 6 shows that low laser power (a, b) induces growth of SiGe crystals while higher power induces melt (c) and ablation (d). Additionally, the mechanical properties of the microcrystalline SiGe layer (FIG. 6 a, b) depend on the relative concentration of Ge. In particular, the elements of the stiffness matrix of SiGe crystals decrease with increasing concentration of Ge, as shown by Eqn. (1) where $c_{11}$, $c_{12}$, $c_{44}$ are the elements of the stiffness matrix, and x is the concentration of Si in the SiGe microcrystal. The elasticity E of a pure shear wave excited in a Si Lame mode resonator is expressed in Eqn. (2) for different excitation directions. The symbol < > indicates the orientation of the Lame mode resonator on a (100) Si wafer. The resonance frequency of a Lame mode is simply expressed by Eqn. (3) where L is the length of the square plate resonator and $\rho$ is the density. The described systems and methods allow for frequency trimming where no ablation is observed.

Fabrication

Two different fabrication techniques have been used to define HAR capacitive trenches. The first set of Lame mode resonators has been created using the Multiplex Pro ASE HRM Deep Reactive Ion Etcher (DRIE). While HAR trenches (1:40) are routinely produced using DRIE, another set of Lame mode resonators have been defined by using a novel fast wet-etch fabrication technique, namely metal-assisted chemical etching (MaCE), which takes advantage of localized Si oxidation and $SiO_2$ removal in a wet bath of hydrogen peroxide ($H_2O_2$) and hydrofluoric acid (HF). While sub-micron and HAR trenches (1:16) are also routinely etched using MaCE, porous Si (pSi) is formed at the vicinity of the capacitive trenches and deteriorates the electrostatic transduction mechanism (FIG. 4). However, careful doping choice of the Si wafer could suppress the formation of pSi. DRIE-defined resonators have been capacitively measured while MaCE-defined resonators have been optically measured using a Laser Doppler Vibrometer (LDV).

Experimental Results

Figure 8A:
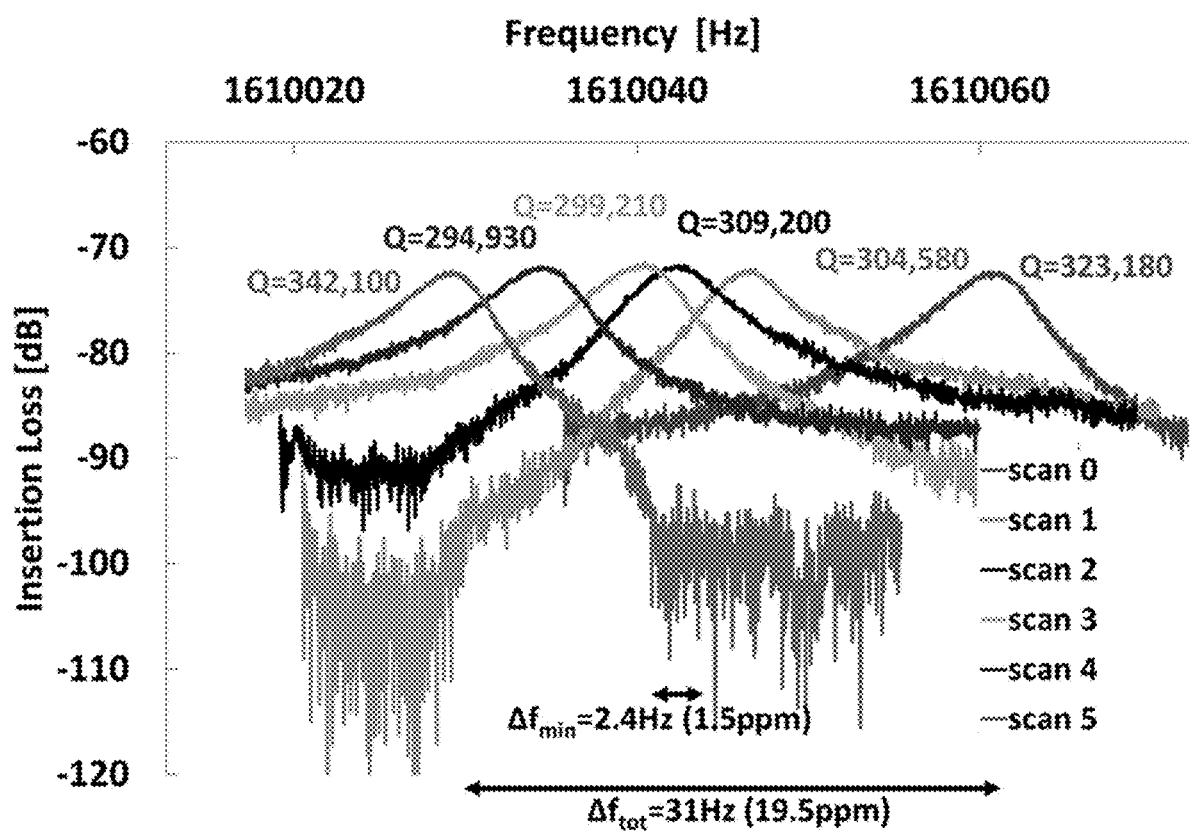
FIGS. 8a and 8b show graphical representations of frequency for precise trimming range and large trimming range respectively, in accordance with one or more embodiments of the present disclosure.
Figure 8B:
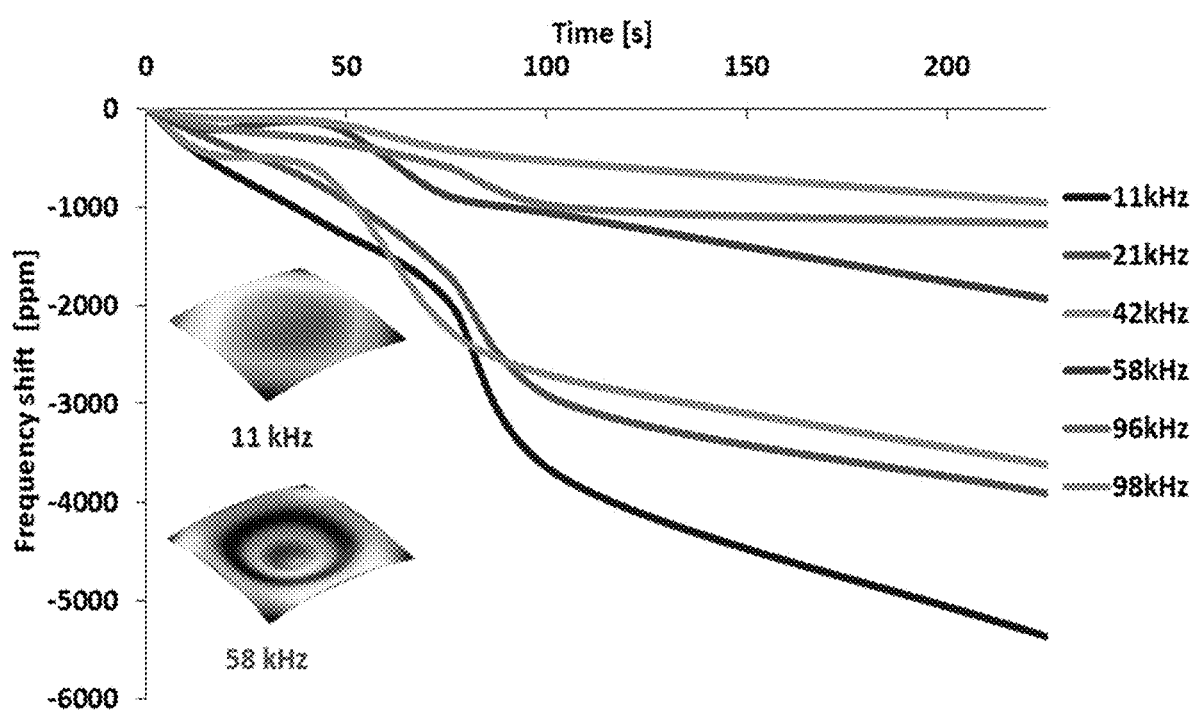

As expected, by combining Eqns. (1)-(3) and without increased damping, the resonance frequency of the Lame mode (FIG. 8a) and the low frequencies of the out-of-plane resonant modes (FIG. 8b) are found to shift downward during pulsed UV laser-based stiffness trimming. FIG. 8a shows that precise downward frequency trimming of a DMA-defined in-plane Lame mode resonator in the range of 1-4 ppm is achieved during each laser scan. Further scanning the surface with the UV laser would extend the permanent 20 ppm downward frequency shift. FIG. 6 shows that large trimming range (~5,000 ppm) of low stiffness out-of-plane resonant modes of a MaCE-defined resonator is observed using an LDV. During frequency trimming, the UV laser beam is first focused at the center of the Si MEMS resonator and then periodically scans the surface to avoid ablating the Ge thin-film layer. The laser scans throughout the whole length of the resonator in the y direction, and then steps approximately 100 µm in the x direction, before scanning again in the y direction. The scan is completed after completing 10 steps in the x direction. The laser scan is centered on the center of the resonator where the Lame develops the largest amount of strain energy (e.g. FIGS. 2 and 3).

Figure 7A:
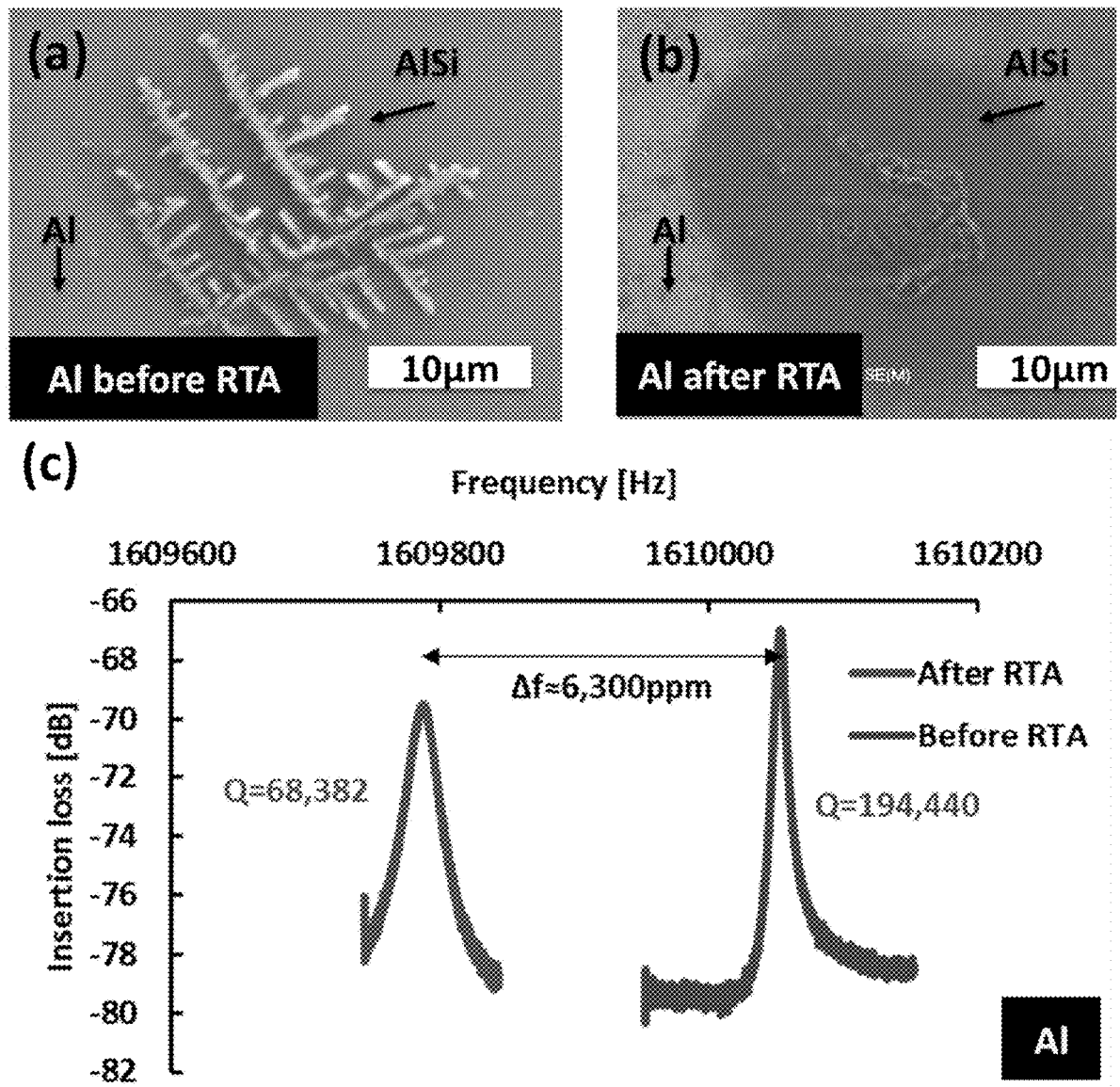
FIGS. 7a and 7b show the frequency and quality factor differences between SiAl eutectics and SiGe eutectics following Rapid Thermal Annealing, in accordance with one or more embodiments of the present disclosure.
Figure 7B:
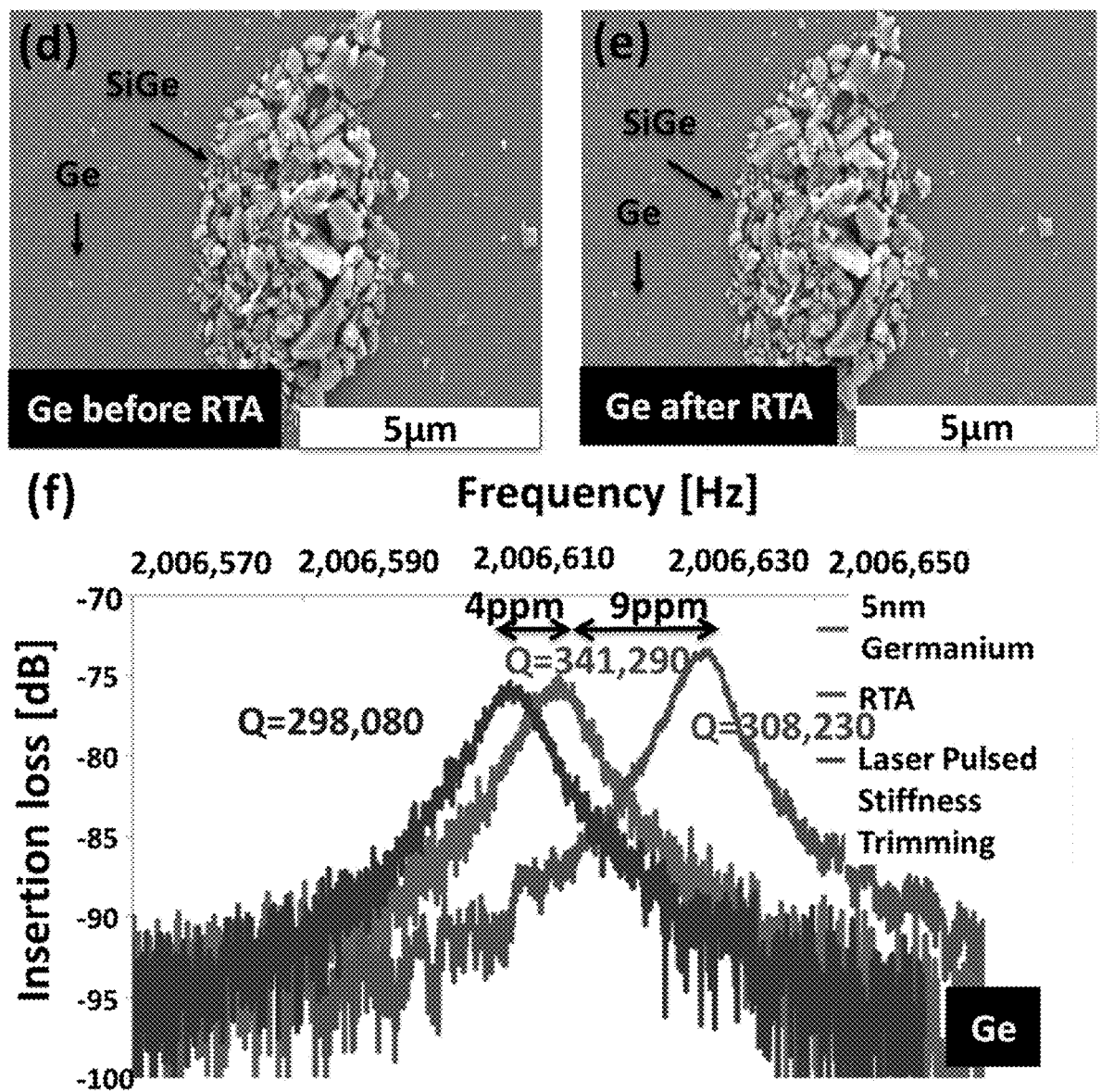

In addition, the absence of temperature hysteresis (FIGS. 7a and 7b) demonstrates the thermal stability of optically trimmed Ge-coated high Q Si resonators heated at 450° C. for 30 min. In comparison, Al is found to thermomigrate and induce undesired frequency shifts, even though the temperature threshold of Al—Si binary systems $T_{Al-Si}$ is above 450° C. (FIGS. 7a and 7b).

Furthermore, the SEM images indicate that while Al thermomigrates within Si, leaving residual Al on the surface, SiGe crystals are not modified when heated at 450° C. More precisely, no further growth of the SiGe crystal is observed neither any diffusion of the SiGe crystal within Si is detected. Although, a slight increase of the resonance frequency is observed after annealing the Ge-coated resonator at 450° C., any further crystallization would have induced a downward frequency shift. The frequency variation is assumed to stem from stress that occurred when wire bonding the resonator on the testing board after heating the Ge-coated resonator in the RTA chamber.

CONCLUSIONS

High resolution stiffness trimming of high Q Lame mode silicon resonators has been demonstrated. Irradiating a thin-film of Ge on top of structural Si with a pulsed UV laser creates SiGe microcrystals with controllable stiffness. Over 5,000 ppm of trimming has been measured on MaCE-defined square resonators vibrating in their low-frequency out-of-plane mode. The frequency characteristics of Ge-coated Si resonators stayed stable at high processing temperatures (at least 450° C.). Deposition of Ge on Si and growth of SiGe crystals has not introduced any significant damping in low-loss bulk-mode resonators.

We claim:

1. A method of selective alloying comprising:
    locally heating a first portion of a first composition to a diffusion temperature sufficient to diffuse at least a portion of the locally heated first portion of the first composition into a second composition;
    wherein a second portion of the first composition remains undiffused into the second composition;
    wherein the localized heating of the first portion of the first composition does not raise the temperature of the second portion of the first composition to the diffusion temperature;
    wherein the first composition and the second composition comprise a microelectromechanical resonator;
    wherein the first composition is a loading element layered on a surface of the second composition comprising a substrate; and
    wherein the locally heating uses an optical energy source.

2. The method of claim 1, wherein the loading element comprise at least one of germanium, gold, aluminum, silver, lead, platinum, iron, copper, aluminum oxide, silicon, or nickel; and
    wherein the substrate comprises at least one of silicon, sapphire, aluminum nitride, diamond, silicon nitride, or silicon carbide.

3. The method of claim 1 further comprising cooling the diffused portion of the loading element and substrate;
    wherein the loading element is selected based on strain energy measured within the diffused portion of the loading element and substrate.

4. The method of claim 1, wherein the loading element comprises germanium;
    wherein the substrate comprises silicon; and
    wherein the diffusion temperature is between 900 and 1000 Centigrade.

5. The method of claim 1, wherein the optical energy source comprises an ultra-violet laser; and
    wherein locally heating comprises emitting, by the ultra-violet laser, ultra-violet light onto the loading element.

6. A method for frequency trimming a microelectromechanical resonator, the resonator comprising a substrate and two or more loading elements layered on one or more surfaces of the substrate and physically separated one from the other, the method comprising:
    selecting a first loading element of the two or more loading elements for frequency trimming;
    locally heating the first loading element to a predetermined temperature sufficient to diffuse at least a portion of the first loading element into the substrate to form a composition layer; and
    cooling the composition layer to bond the diffused portion of the first loading element and the substrate;
    wherein the localized heating of the first loading element does not raise the temperature of a second loading element of the two or more loading elements to the predetermined temperature and the second loading element remains undiffused into the substrate.

7. The method of claim 6, wherein the resonator is disposed on a wafer and trimming is performed at the wafer level.

8. The method of claim 6, wherein the first loading element comprises germanium;
    wherein the substrate comprises silicon; and
    wherein the predetermined temperature is between 900 and 1000 Centigrade.

9. The method of claim 6, wherein the locally heating uses an optical energy source;
    wherein the resonator is fabricated on a wafer and comprises a packaging layer that is transparent to the optical energy source; and
    wherein the frequency trimming is performed post-packaging.

10. A method of shifting a resonator frequency from a first resonance frequency to a second resonance frequency, the resonator comprising a first composition and a second composition, the method comprising:
    locally heating a first portion of the first composition to a diffusion temperature sufficient to diffuse at least a portion of the locally heated first portion of the first composition into the second composition;
    wherein prior to the step of locally heating, the resonator has the first resonance frequency; and
    wherein subsequent the step of locally heating, the resonator has the second resonance frequency.

11. The method of claim 10 further comprising cooling the diffused portion of the first composition and the second composition to form a third composition comprising a mixture of the first composition and the second composition;
 wherein the first composition comprises a loading element;
 wherein the second composition comprises a substrate;
 wherein the first portion and a second portion of the loading element are physically separated one from other;
 wherein locally heating comprises locally heating with laser light the first portion of the loading element; and
 wherein the localized heating of the first portion of the loading element does not raise the temperature of the second portion of the loading element to the diffusion temperature.

12. The method of claim 11, wherein the loading element comprises at least one of germanium, gold, aluminum, silver, lead, platinum, iron, copper, aluminum oxide, silicon, or nickel; and
 wherein the substrate comprises at least one of silicon, sapphire, aluminum nitride, diamond, silicon nitride, or silicon carbide.

13. The method of claim 11, wherein the resonator is selected from the group consisting of a silicon bulk acoustic resonator, a film bulk acoustic wave resonator, a high-Q single-crystal resonator, a microelectromechanical resonator, and a Coriolis gyroscope.

14. The method of claim 11, wherein the first composition comprises germanium;
 wherein the substrate comprises silicon;
 wherein the third composition comprises a eutectic; and
 wherein the diffusion temperature is between 900 and 1000 Centigrade.

15. The method of claim 11, wherein the laser light comprises ultra-violet light emitted by an ultra-violet laser at a predetermined wavelength chosen based on absorption characteristics of the locally heated portion of the first portion of the loading element.

16. The method of claim 11, wherein applying laser light comprises emitting light onto a region of interest at a predetermined wavelength of between 10 and 1100 nm based on absorption characteristics of the locally heated portion of the first portion of the loading element.

17. The method of claim 10, wherein the locally heating uses an optical energy source; and
 wherein the resonator is fabricated on a wafer and comprises a packaging layer that is transparent to the optical energy source.

* * * * *